(12) United States Patent
Heinrich

(10) Patent No.: US 8,370,726 B2
(45) Date of Patent: Feb. 5, 2013

(54) SOFT OUTPUT VITERBI DECODER ARCHITECTURE

(75) Inventor: Vincent Heinrich, Izeaux (FR)

(73) Assignee: STMicroelectronics S.A., Montrouge (FR)

( * ) Notice: Subject to any disclaimer, the term of this patent is extended or adjusted under 35 U.S.C. 154(b) by 392 days.

(21) Appl. No.: 12/817,613

(22) Filed: Jun. 17, 2010

(65) Prior Publication Data

US 2010/0325525 A1 Dec. 23, 2010

(30) Foreign Application Priority Data

Jun. 19, 2009 (FR) ...................................... 09 54172

(51) Int. Cl.
*H03M 13/00* (2006.01)
*H03M 13/41* (2006.01)

(52) U.S. Cl. ........................................ 714/780; 714/795
(58) Field of Classification Search .................. 714/780, 714/795
See application file for complete search history.

(56) References Cited

U.S. PATENT DOCUMENTS

| | | | | | |
|---|---|---|---|---|---|
| 5,995,562 | A * | 11/1999 | Koizumi | ........................ | 375/341 |
| 6,438,723 | B1 * | 8/2002 | Kalliojarvi | ..................... | 714/751 |
| 6,487,694 | B1 * | 11/2002 | Bajwa | ............................ | 714/786 |
| 6,581,182 | B1 * | 6/2003 | Lee | ................................. | 714/795 |
| 6,587,987 | B1 * | 7/2003 | Vasic et al. | ...................... | 714/780 |
| 6,662,337 | B1 * | 12/2003 | Brink | .............................. | 714/792 |
| 7,032,163 | B2 * | 4/2006 | Yano et al. | ...................... | 714/786 |
| 7,085,992 | B2 * | 8/2006 | Becker et al. | ................... | 714/795 |
| 7,222,288 | B2 * | 5/2007 | Varma et al. | ................... | 714/795 |
| 7,607,072 | B2 * | 10/2009 | Ashley et al. | .................. | 714/792 |
| 7,730,384 | B2 * | 6/2010 | Graef et al. | ...................... | 714/780 |
| 8,015,499 | B2 * | 9/2011 | Kanaoka | ........................ | 715/780 |
| 8,037,394 | B2 * | 10/2011 | Djurdjevic et al. | ............ | 714/780 |

OTHER PUBLICATIONS

French Search Report dated Feb. 5, 2010 from corresponding French Application No. 09/54172.
Luca Reggiani, et al., *A Reduced-State Soft Input Soft Output AlgorithmBased on State Partitioning*, Internet Article, 2001, XP002566296 Internet URL: http://www.gmmaggio.com/publications/conferences/2001/globecom_2001-siso.pdf>.
Mark Bickerstaff, *A Unified Turbo Viterbi Channel Decoder for 3GPP Mobile Wireless in 0.18mu CMOS*, Internet Article 2002, XP002566297, Internet URL: http://ieeexplore.ieee.org/stamp/stamp.

* cited by examiner

*Primary Examiner* — James C Kerveros
(74) *Attorney, Agent, or Firm* — Wolf, Greenfield & Sacks, P.C.

(57) ABSTRACT

A soft output Viterbi algorithm (SOVA) decoder arranged to decode symbols received over a transmission channel, the symbols indicating a state transition between two states of a plurality of states that determines a decoded data value, the SOVA decoder comprising a reliability memory unit including at least four stages of logic units, each logic unit including a single buffer and at least four stages including a plurality of full stages comprising a separate logic unit corresponding to each of the plurality of states; and a plurality of compact stages including half or less than half the number of logic units than the number of the plurality of states, each logic unit corresponding to two of the plurality of states.

25 Claims, 5 Drawing Sheets

SOFT OUTPUT VITERBI DECODER ARCHITECTURE

CROSS REFERENCE TO RELATED APPLICATIONS

This application claims the priority benefit of French patent application number 09/54172, filed on Jun. 19, 2009, entitled "SOFT OUTPUT VITERBI DECODER ARCHITECTURE," which is hereby incorporated by reference to the maximum extent allowable by law.

BACKGROUND OF THE INVENTION

1. Field of the Invention

The present invention relates to a soft output Viterbi algorithm (SOVA) decoder and a method of performing SOVA decoding.

2. Background of the Invention

Convolutional encoders are types of encoders that generate a symbol to be transmitted based on a current state determined using one or more previous input values. Such encoders are generally implemented by a finite state machine.

Decoding a received signal originating from a convolutional encoder involves finding the most probable sequence of emitted data, based on the information received from the transmission channel.

A soft-decision output Viterbi algorithm (SOVA) has been proposed, which uses the log-likelihood ratios (LLR) generated based on the received symbols to generate, in parallel to the decoded data, an indication of the reliability of the decoded data.

SOVA decoders generally comprise a survivors memory unit (SMU) formed of a series of multiplexer stages each comprising multiplexers for each state and used to perform a trace back algorithm on values determined by a number L of previous symbols. The SMU thereby evaluates multiple sequences of state transitions, and by switching the multiplexers based on the most likely paths, reduces these paths to a single survivor path, which indicates the decoded data as a hard decision value after a delay of L symbols.

A reliability memory unit (RMU), formed of a series of logic stages, operates in parallel to the SMU, and processes path metric differences (PMDs) based on the most probable paths determined by the SMU. The PMDs are determined based on the LLR values, and indicate the difference in probabilities between two paths. Each of the logic stages comprises a logic unit for each state, and the PMD values are propagated through these logic units based on hard decisions from the SMU, in order to determine reliability values for the survivor paths.

A problem of SOVA decoders is that they are relatively complex to implement and costly in terms of hardware resources. In particular, to recover a sequence based on symbols of S bits generated by a convolutional encoder of NS states, the number of states NS is generally a power of 2, $NS \times 2^S$, a state corresponding to each symbol, and $8^S$ paths are evaluated, because from each state, there are generally two possible state transitions. The data to reduce these paths needs to be stored and evaluated. In particular, each of the logic units of each stage of the RMU comprises a buffer for storing the generated reliability values for one symbol period. Assuming that there are L stages and that each stage comprises NS logic units, there would be NS×L logic units, each having a memory capable of storing one multiple-bit reliability value. The memory used by these logic units can be high.

SUMMARY OF THE INVENTION

It is an aim of embodiments of the present invention to at least partially address one or more problems in the prior art.

According to a first aspect of the present invention, there is provided a soft output Viterbi algorithm (SOVA) decoder arranged to decode symbols received over a transmission channel, the symbols indicating a state transition between two states of a plurality of states that determines a decoded data value, the SOVA decoder comprising a reliability memory unit comprising at least four stages of logic units, the logic units of one stage being coupled to the next based on the possible state transitions, the RMU being arranged to generate, at an output of a final stage of the at least four stages, a reliability value corresponding to a decoded data value of a received symbol, each of the logic units comprising circuitry for determining a new reliability value and a single buffer for storing the new reliability value, the at least four stages comprising: a plurality of full stages controlled based on the previous $L_F$ symbols received, each full stage comprising a separate logic unit corresponding to each of said plurality of states; and a plurality of compact stages controlled based on at least one symbol received prior to the previous $L_F$ symbols, each compact stage comprising half or less than half the number of logic units than the number of said plurality of states, each logic unit corresponding to two of said plurality of states.

According to one embodiment of the present invention, each logic unit of each compact stage comprises the functionality of at least two of said logic units of said plurality of full stages and a single buffer for storing the new reliability value.

According to another embodiment of the present invention, each logic unit of a first plurality of said compact states comprises the functionality of two of said logic units of said plurality of full stages and each logic unit of a second plurality of said compact states comprises the functionality of four of said logic units of said plurality of full stages.

According to another embodiment of the present invention, the final stage comprises a single logic unit.

According to another embodiment of the present invention, the SOVA decoder further comprises a survivors memory unit comprising a plurality of stages of SMU multiplexers coupled in series, each stage of SMU multiplexers comprising an SMU multiplexer corresponding to each of said plurality of states, the SMU multiplexers of one stage being coupled to the next based on the possible state transitions between said states, and each SMU multiplexer being controlled based on the log-likelihood ratio value for a current received symbol, wherein the outputs of the SMU multiplexers are used to control logic units of the corresponding stages of the reliability memory unit.

According to another embodiment of the present invention, each of the full stages comprises: a first multiplexer comprising first and second inputs each coupled to receive respective reliability values and an output for outputting the value at one of the first and second inputs selected based on the most probable state transition determined for a current received symbol; and a second multiplexer comprising a first input coupled to the output of the first multiplexer and a second input coupled to receive a value determined based on the output of the first multiplexer and a path metric difference value, and an output for outputting the value at one of the first and second inputs selected based on the outputs of corresponding SMU multiplexers.

According to another embodiment of the present invention, each logic unit of the first and second plurality of compact stages comprises one or more third multiplexers comprising first and second inputs each coupled to receive respective reliability values, a third input coupled to receive a value determined based on values at the first and second inputs, and an output for outputting the value of one of the first, second and third inputs selected based on the most probable state transitions determined for a current state transition; and a fourth multiplexer comprising a first input coupled to the output of the one or more third multiplexers and a second input coupled to a value determined based on the output of the one or more third multiplexers and a path metric difference value, and an output for outputting the value of one of the first and second inputs selected based on the outputs of corresponding SMU multiplexers.

According to another embodiment of the present invention, the SMU multiplexers of a first stage of said SMU receive respective input values $D_i$ based on the most probable state transition determined based on a current symbol, and wherein said at least one third multiplexer of each logic unit of said first plurality of stages is controlled based on two of said input values.

According to another embodiment of the present invention, the SMU multiplexers of a first stage of said SMU receive respective input values $D_i$ based on the most probable state transition determined based on a current symbol, and wherein said at least one third multiplexer of each logic unit of said second plurality of stages is controlled based on four of said input values.

According to another embodiment of the present invention, the SOVA decoder further comprises at least one control block arranged to generate control signals for controlling said at least one third multiplexer based on said input values $D_i$.

According to another embodiment of the present invention, the value at the third input of the one or more multiplexers of each logic unit of each compact stage is determined as the minimum of the first and second inputs, and the value at the second input of the second multiplexer of each logic unit of each compact stage is determined as the minimum of the output of the third multiplexer and the corresponding path metric difference value.

According to a further aspect of the present invention, there is provided a decoding system comprising an input for receiving log-likelihood values relating to received symbols and the above SOVA decoder.

According to a further aspect of the present invention, there is provided a set-top box or a mobile telephone, comprising the above decoding system.

According to a further aspect of the present invention, there is provided a transmission system comprising a convolutional encoder arranged to generate symbols based on the state of a finite state machine, said state being determined based on a current data bit and one or more previous data bits to be encoded, and the above decoding system.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
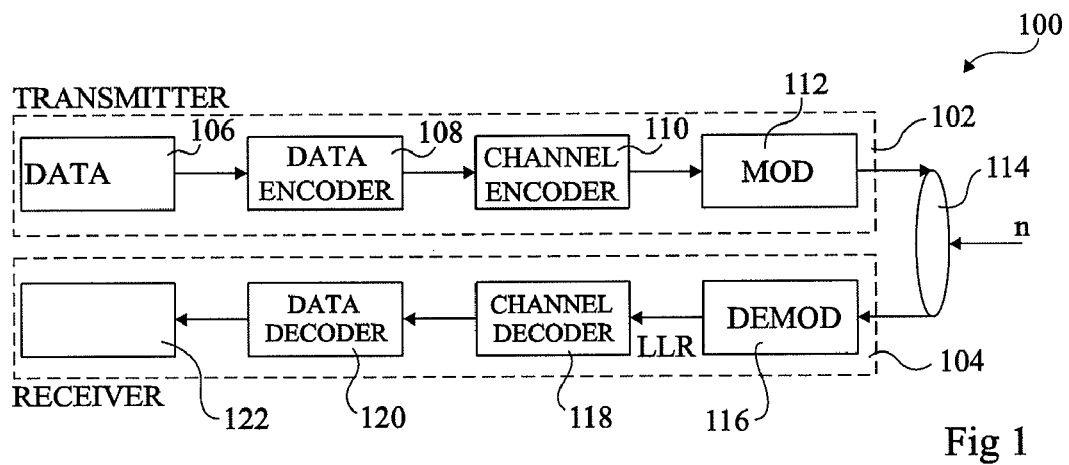
FIG. 1 illustrates a data transmission system according to an embodiment of the present invention.

FIG. 1 illustrates a data transmission system 100 comprising a transmitter 102 and a receiver 104. The transmitter 102 comprises a data source 106, which is for example a memory or input device for receiving data to be transmitted via the transmission system. A data encoder 108 compresses the data from the data source 106 to increase the data rate, for example, according to an MPEG or H264 standard. The encoded data is then provided to channel encoder 110, which performs channel encoding on the compressed data, and generates data symbols, in this case based on a convolution algorithm. A modulation block 112 then modulates the data symbols from the channel encoder such that they are suitable for transmission over a transmission channel 114. The modulation is for example QAM (quadrature amplitude modulation), such as rectangular or non-rectangular QAM, although other types of modulation would be possible.

Transmission channel 114 is for example a wireless channel, such as a satellite broadcasting channel, WLAN (wireless local area network) channel, terrestrial digital television channel or mobile network channel. Alternatively, the channel could be wired, such as a cable or ADSL (Asymmetric digital subscriber line) interface. Some noise NS is introduced in the modulated data signal.

The receiver 104 comprises a demodulator block 116, which receives the signal from the channel 114, and demodulates the signal to determine log-likelihood ratio (LLR) values corresponding to the received data symbols. The LLR values are provided to a channel decoder 118, which performs channel decoding, in this example using a soft output Viterbi algorithm (SOVA) decoder, to retrieve the originally compressed data.

The compressed data is then either stored, or processed by a data decoder 120 to recuperate the original data, which may be provided to output circuitry 122, which is for example a memory, display or other output device. The receiver 104 is for example a set-top box, which can be connected to a television for receiving a cable, terrestrial or satellite signal. Alternatively, receiver 104 could be a mobile telephone, or other electronic device arranged to receive encoded data transmitted over a transmission channel.

Figure 2:
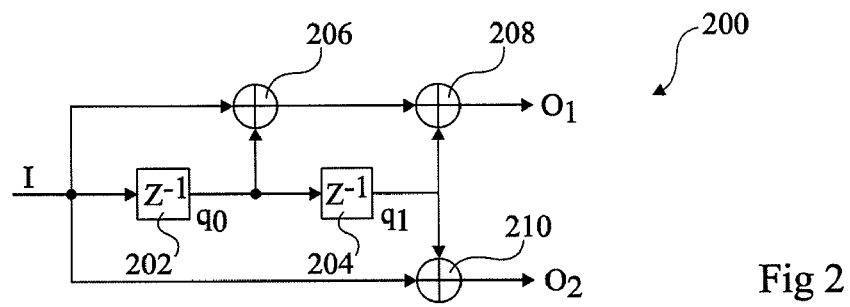
FIG. 2 illustrates a finite state machine for implementing a convolutional encoder according to an embodiment of the present invention.

FIG. 2 illustrates a simple example of a finite state machine (FSM) 200 for implementing a convolutional encoder of the channel encoder 110 of FIG. 1. FSM 200 comprises an input I for receiving bits to be encoded, and delay elements 202 and 204 coupled in series, each delaying the input I by one cycle to provide bits $q_0$ and $q_1$ respectively. A modulo 2 adder 206 is arranged to add together the current bit from input I and the previous bit $q_0$ from delay element 202, a modulo 2 adder 208 is arranged to add together the output of modulo 2 adder 206 and the bit $q_1$ at the output of delay element 204, and a modulo 2 adder 210 is arranged to add together the current bit I with the bit $q_1$ at the output of delay element 204. The outputs from adders 208 and 210 provide output bits $O_1$ and $O_2$ respectively, which are based on the current bit I and two previous bits $q_0$, $q_1$. The output bits $O_1$ and $O_2$ provide the symbols to be transmitted over the transmission channel.

Figure 3:
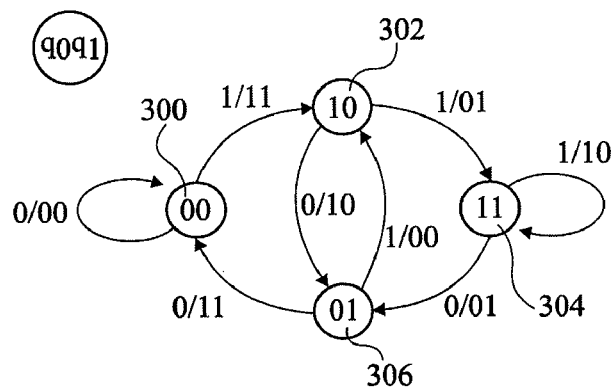
FIG. 3 shows a state diagram corresponding to the finite state machine of FIG. 2.

FIG. 3 illustrates the state diagram corresponding to the finite state machine of FIG. 2. There are four states 300, 302, 304 and 306, in which the bit values $q_0$ and $q_1$ are "00", "10", "11" and "01" respectively. From each of these states, the possible state transitions are shown by arrows labelled in the form $I/O_1O_2$. In particular, the next state is determined by the input bit I, and the 2-bit symbol output during this state transition corresponds to the output bits $O_1O_2$. For example, from state 300, in which the two previous bits $q_0$ and $q_1$ were both "0", if the current bit I is also "0", the next state is state 300, and the output symbol is "00", whereas if the current bit I is "1", the next state is 302, and the output symbol is "11".

On the receiver side, the channel decoder 118 receives the LLR values corresponding to each bit of each symbol, and determines the original bits I. To do this, it has been proposed to use Viterbi decoding based N previous symbols that have been received, and the state transition decision made after each symbol. The principle will now be described with the aid of the trellis diagram of FIG. 4.

Figure 4:
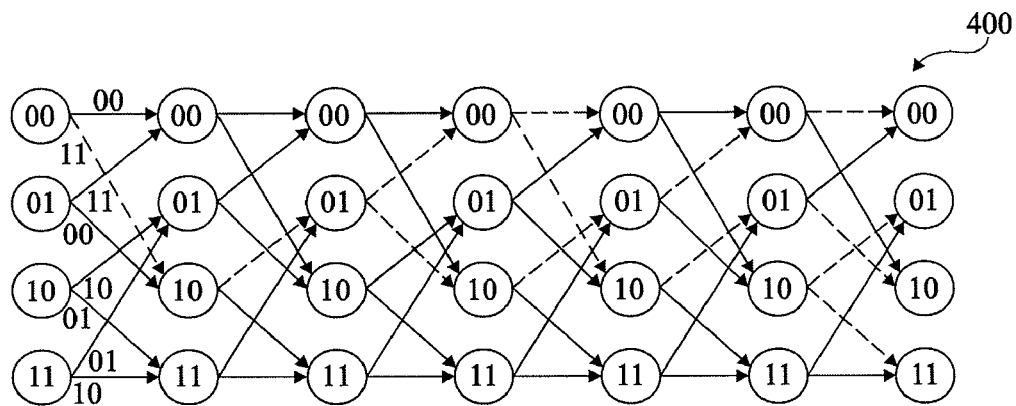
FIG. 4 shows a trellis diagram illustrating the principle behind Viterbi decoding.

FIG. 4 illustrates a trellis diagram 400 corresponding to decoding symbols originally encoded by the finite state machine of FIG. 2. The four states of $q_0$ and $q_1$ are shown in each of seven columns, provided with interconnecting arrows to represent all of the possible paths between the states during six consecutive state transitions. In this example, from each of the four states, there is a choice of two different next states. As shown for the transition from the left hand column of states to the adjacent column of states, each state transition corresponds to a different received symbol.

Dashed lines in FIG. 4 show the most probable state transitions, one path per state being conserved, and demonstrate that after a certain number of transitions L, in this example six transitions, the probable paths merge to a single path. Using this principle, the data bits I can be decoded with a delay of L symbol periods.

Figure 5A:
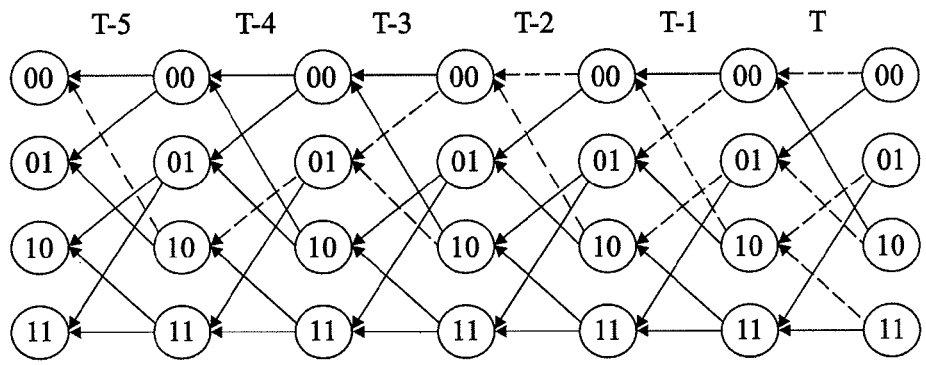
FIG. 5A shows the trellis diagram of FIG. 4 illustrating the principle of a trace back algorithm.
Figure 5B:
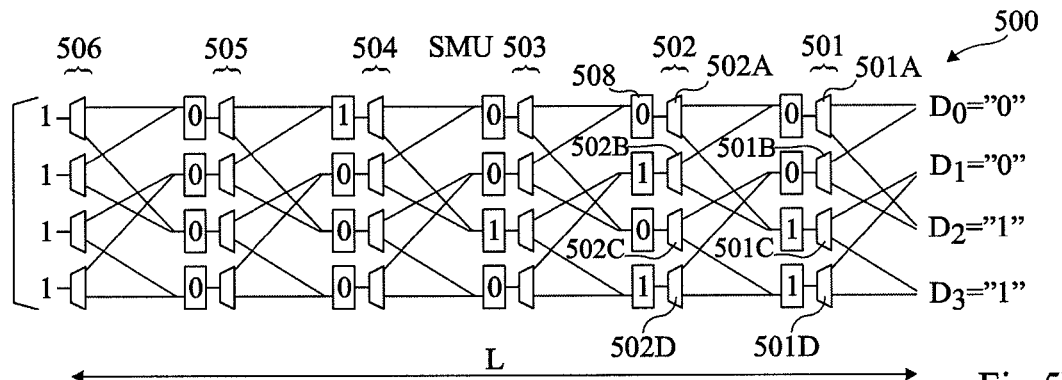
FIG. 5B illustrates a survivors memory unit according to an embodiment of the present invention.

FIGS. 5A and 5B illustrates how paths can be merged into a single path, based on the six previous state transitions T to T−5. In particular, as shown in the trellis diagram of FIG. 5A, for each new symbol, it is determined, for each state, which is the most probable previous state from which the state transition occurred. For example, it is determined that in transition T, given the received symbol I, the transition to state "00" is most likely to have been from state "00". Similar decisions are made for the other states "01", "10" and "11".

While for some transitions it is determined that for each of the current states the most probably previous states are all different, for other transitions the most probable previous state for two of the four current states is the same state. This is the case for current states "01" and "11" in transition T, for which the most probable previous state is the same state "10". This means that one of the other possible previous states can be ruled out, along with the corresponding path. Each time this happens, the number of paths is reduced, until there is a single path left, which indicates the state transition, and thus the input bit I, that was transmitted.

FIG. 5B illustrates an SMU (survivors memory unit) 500 for implementing Viterbi decoding based on the trellis of FIG. 5A. The SMU 500 comprises stages of multiplexers, each stage 501 to 506 corresponding to a respective state transition T to T−5 of the trellis, and one multiplexer of each stage corresponding to each of the states to which a state transition may occur. Thus, in the example of FIG. 5, as there are four possible states, there are four multiplexers in each stage. Each multiplexer has two data inputs and one data output, and a one-bit buffer 508 is provided at the output of each multiplexer to store the output until a next cycle during which it is propagated to the next stage.

Four inputs $D_0$ to $D_3$ in this example equal to "0", "0", "1" and "1", are fed into the first stage 501 of multiplexers, the first stage comprising multiplexers 501A, 501B, 501C and 501D corresponding to the transitions to the four current states "00", "01", "10" and "11" of the trellis diagram respectively. The values $D_i$ are determined based on the chosen state transitions for the current state transition T. Thus in this example, the values of $D_i$ are $D_0$="0", $D_1$="0", $D_2$="1" and $D_3$="1", corresponding to the most probable transitions determined for state transition T as shown in the trellis of FIG. 5A.

$D_0$ is provided to an input of multiplexers 501A and 501B, $D_1$ to an input of multiplexers 501C and 501D, $D_2$ to an input of multiplexers 501A and 501B, and $D_3$ to an input of multiplexers 501C and 501D. The multiplexers are interconnected in the same way as the states of the trellis of FIG. 5A. In particular, the outputs of the buffers 508 at the outputs of multiplexers 501A and 501C are coupled to inputs of multiplexers 502A and 502B, while the output of buffers 508 at the outputs of multiplexers 501B and 501D are coupled to inputs of multiplexers 502C and 502D. The other stages of multiplexers are coupled together in a similar fashion.

Although not shown in FIG. 5B, each multiplexer is controlled based on the most probable paths, as determined by the LLR values for each received symbol. In particular, when each new symbol is received, NS control signals are generated based on the selected transition for each new state and all the multiplexers of a same line, in other words corresponding to the same state in each stage, receive the same control signal.

Based on the hard decisions stored by each multiplexer of the SMU of FIG. 5B, a SOVA decoder determines a soft-decision output for each data bit, which provides information regarding the reliability of the decoded data. For example, reliability values can subsequently be used to remove further errors by means of a different type of channel decoder functioning based on soft decisions. To do this, a reliability memory unit (RMU) is used.

Figure 6:
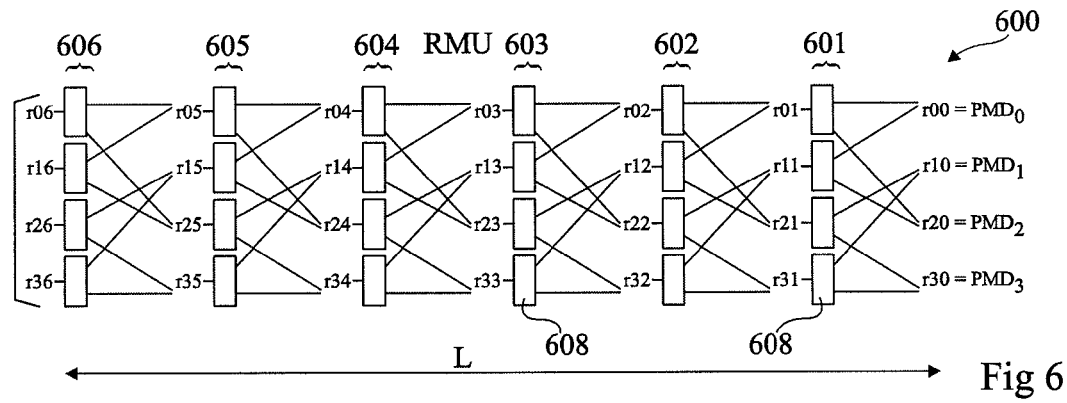
FIG. 6 illustrates a reliability memory unit of a SOVA decoder.

FIG. 6 shows an RMU 600, which in this example comprises six stages 601 to 606 of RMU logic units 608 corresponding to the possible states after transitions T to T−5 respectively. Each stage comprises a logic unit 608 corresponding to each possible state, and between stages the logic units are inter-connected in the same way as the multiplexers of the SMU. However, rather than receiving the values $D_0$ to $D_3$, the first stage 601 of logic units receive at their input terminals reliability values r00, r10, r20 and r30, equal to path metric difference (PMD) values, indicating the difference in probability between the two corresponding paths. For example, reliability value r00 is equal to $PMD_0$, which is the difference in probability between the previous state being "00" and the previous state being "01". For example, the PMD values are 6 bit unsigned values. A low value of nearly 0, for example, implies very low reliability, and a high value of close to 63, for example, implies high reliability. Thus, if the probabilities of the two paths are relatively equal, the PMD will be very low, whereas if one of the paths is much more probable than the other, the PMD will be high.

Figure 7:
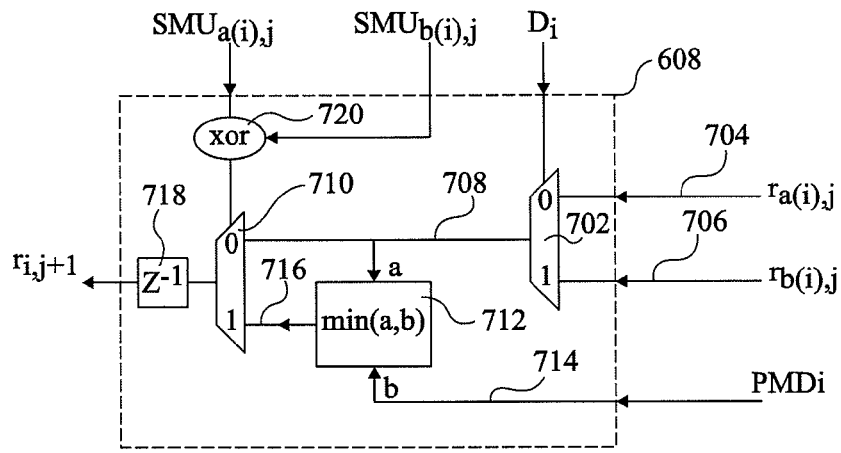
FIG. 7 illustrates a logic unit of the reliability memory unit of FIG. 6 in more detail according to an embodiment of the present invention.

FIG. 7 illustrates an RMU logic unit 608 of FIG. 6 in more detail. It is assumed in the following that the logic unit is the $i^{th}$ logic unit of stage j. The logic unit 608 comprises a multiplexer 702 having two data inputs for receiving, on one of the inputs 704, the output $r_{a(i),j}$ from the previous stage j, and on the other input 706, the value $r_{b(i),j}$ from the previous stage j, in this example i being equal to between 0 and 3 for the respective logic units of each stage, NS being the number of states, in this case 4, and j being 0 for the first stage 601, 1 for the second stage 602, etc. and L−1 for the final stage. The functions a(i) and b(i) depend on the particular state transitions that are possible according to the trellis. In the present example a(i)=$\lfloor i/2 \rfloor$ and b(i)=$\lfloor i/2 \rfloor$+2, wherein the function $\lfloor x \rfloor$ is the "integer part" of x, defined as the largest integer lower than x.

The output of multiplexer 702 on an output line 708 is coupled to an input of a multiplexer 710, and also to a function block 712, which performs the minimum function min(a,b) on the value on line 708 and the value $PMD_i$ received on a further input line 714. The output of function block 712 on an output line 716 is provided as a further input to multiplexer 710, the output of which is coupled to a buffer 718, which stores the value for one symbol period. The output of buffer 718 is the output of the logic unit 608.

Multiplexer 702 is controlled by the signal $D_i$ calculated for each new symbol received, and corresponding to the value $D_i$ at the input of the SMU 500. Multiplexer 710 is controlled by the signal from an XOR gate 720, which performs the exclusive OR function on the signals $SMU_{a(i),j}$ and $SMU_{b(i),j}$ at the outputs of the corresponding multiplexers of the SMU.

In operation, if the values $SMU_{a(i),j}$ and $SMU_{b(i),j}$ at the outputs of the corresponding multiplexers are the same, this implies that there will be no difference in the decision based on the selection of one path over the other. Thus, as controlled by the output of XOR 720, the reliability value is equal to the reliability value $r_{a(i),j}$ or $r_{b(i),j}$ propagated from the adjacent stage, selected based on the value of $D_i$. Alternatively, if the values of $SMU_{a(i),j}$ and $SMU_{b(i),j}$ are different, the path metric difference is evaluated. The XOR 702 will have a high output, such that the output of the function block 712 is selected. The output of function block 712 is the lowest reliability value between the selected reliability value $r_{a(i),j}$ or $r_{b(i),j}$ propagated from the adjacent stage and the value $PMD_i$.

A drawback with the RMU 600 of FIG. 6 is that there is a high number of RMU logic units 608, which each comprises a buffer 718, leading to a high chip area of the circuit, and high power consumption.

Figure 8A:
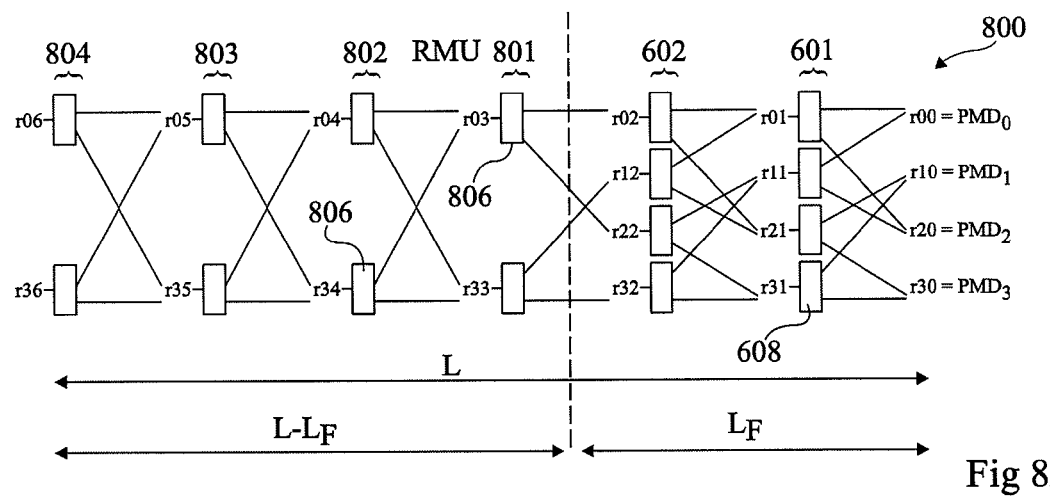
FIG. 8A illustrates a reliability memory unit according to an embodiment of the present invention.

FIG. 8A illustrates an RMU 800 having a different structure to that of FIG. 6. In particular, a number $L_F$ of the stages of RMU 800 that correspond to the $L_F$ previous state transitions are full stages, containing the same number of RMU logic units as the number of states, in this example four logic units. The remaining L−$L_F$ stages corresponding to the state transitions before the $L_F$ previous state transitions contain half the number of logic units. In the example of FIG. 8A, the first two stages 601 and 602 each contain four logic units, while the next four stages 801 to 804 contain just two RMU logic units.

The logic units of the first $L_F$ stages for example have the same structure as logic units 608 of the RMU 600. However, the logic units 806 of the L−$L_F$ half stages comprise modified structures to enable them to merge the functionality of the two of the standard logic units, but with only one buffer for storing the single resulting reliability value.

Advantageously, the reduced number of logic units in the half stages of the RMU 800 significantly reduces the overall number of logic units, and is not significantly detrimental to the performance of the decoder, as after a certain number of stages, the number of paths is also reduced, and so there is still an RMU logic unit corresponding to each survivor path. This principle will now be described with reference to the trellis diagram of FIG. 8B.

Figure 8B:
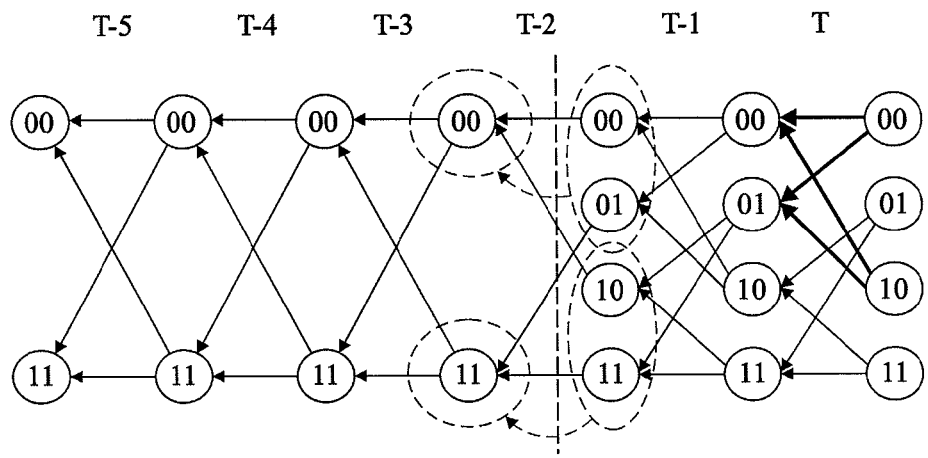
FIG. 8B shows a trellis diagram illustrating the principle of the SOVA decoding using half stages according to an embodiment of the present invention.

As shown by the dashed lines in FIG. 8B, the four possible states during the state transitions T and T−1 can be merged into just two state transitions between the remaining state transitions T−2 to T−5. The states that can be merged correspond to a same butterfly. An example of a butterfly is shown by the bold arrows in FIG. 8B, and implies that the states transition from the same states. In this example, the states are merged to keep only states "00" and "11", however, the state transitions could have been merged to keep only states "01" and "10".

Figure 9:
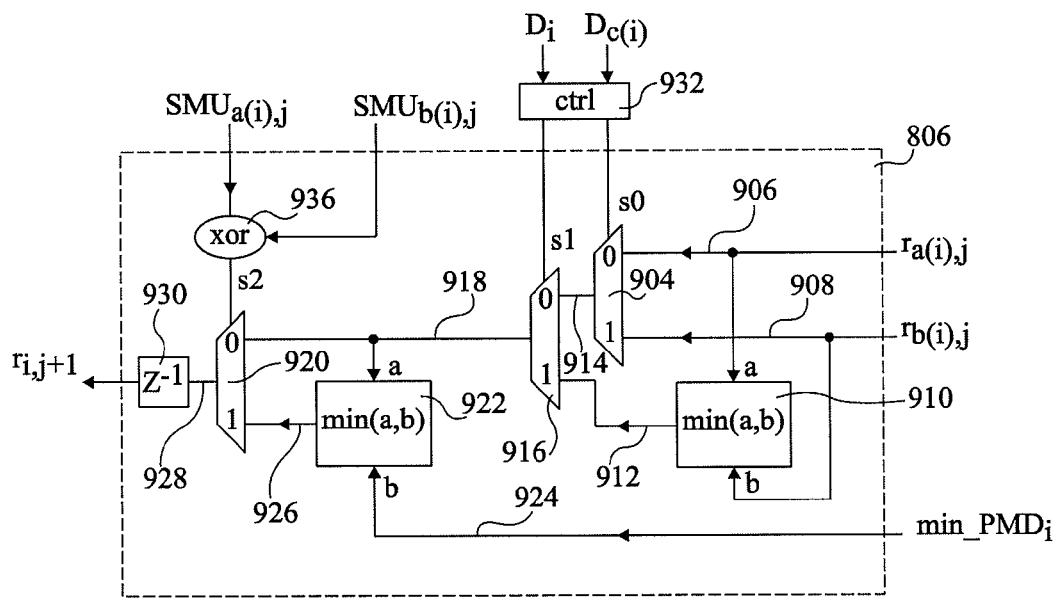
FIG. 9 illustrates a logic unit of the reliability memory unit of FIG. 8B in more detail according to an embodiment of the present invention.

FIG. 9 illustrates a logic unit 806 in more detail. Logic unit 806 comprises a multiplexer 904, which receives on an input line 906 the reliability value $r_{a(i),j}$ and on a second input line 908 the reliability value $r_{b(i),j}$. As previously, in this example i is equal to between 0 and 3 for the respective logic units of each stage, NS being the number of states, in this case 4, and j being 0 for the first stage 601, 1 for the second stage 602, etc. and L−1 for the final stage. Functions a(i) and b(i) depend on the particular state transitions that are possible according to the trellis. In the present example a(i)=$\lfloor i/2 \rfloor$ and b(i)=$\lfloor i/2 \rfloor$+2, wherein the function $\lfloor x \rfloor$ is the "integer part" of x, defined as the largest integer lower than x.

Input lines 906 and 908 are also coupled to the inputs of a function block 910, which for example determines the minimum function min(a,b) of the two input signals, and provides the result on an output line 912. Line 912, along with an output of multiplexer 904 on a line 914, are provided as respective inputs to a further multiplexer 916. Multiplexer 916 provides an output on a line 918, which is coupled to an input of a further multiplexer 920 and also to a function block 922. Function block 922 also receives an input min_$PMD_i$, which for example corresponds to the minimum function min(a,b) applied to PMD values $PMD_i$ and $PMD_{c(i)}$, performed by a function block not shown in FIG. 9. The function block 922 for example determines the minimum function min(a,b) of the value on line 918 and the value min_$PMD_i$ on line 924. The result is provided on an output line 926 as a further input to multiplexer 920. The output of multiplexer 920 on line 928 is delayed by a buffer 930, before being provided as the output $r_{i,j+1}$ of the block 806.

The multiplexer 904 is controlled by a control signal s0, determined by control block 932 as follows:

s0="0" if $D_i$=$D_{c(i)}$="0", else "1"

where the function c(i) is the indice of the RMU logic unit that is combined with block i, in this case i+1.

The multiplexer 916 is controlled by a control signal s1, also determined by the control block 932 as follows:

$$s1=\text{XOR}(D_i, D_c(i))=\text{``0''}$$

Given that for each stage j, the values of $D_i$ and $D_{c(i)}$ do not change, a single control block 932 can be provided for the ith logic unit in each half stage.

The multiplexer 920 is controlled by a control signal provided by the output of an XOR gate 936, which performs the exclusive OR function on the outputs $\text{SMU}_{a(i),j}$ and $\text{SMU}_{b(i),j}$ of the corresponding SMU multiplexers.

In operation, the logic units 806 use information normally provided to update two merged logic units 608, in order to generate a single new value $r_{i,j+1}$. The control block 932 determines whether the transition in each of the merged state transitions is the same, by performing the XOR function on the values $D_i$ and $D_{i+1}$. If s1 is low, the value on line 918 is one of the propagated reliability values $r_{a(i),j}$ and $r_{b(i),j}$. On the other hand, if the selected path transitions in each of the merged states is not the same, s1 is high, meaning that the value on line 918 is the output of function block 910, which is the minimum between the propagated reliability values $r_{a(i),j}$ and $r_{b(i),j}$. It is then determined whether the same state transition occurs based on the values $\text{SMU}_{a(i),j}$ and $\text{SMU}_{b(i),j}$, and if so, the value on line 918 is selected as the new reliability value $r_{i,j+1}$. If not, the minimum between the value on line 918 and the value min_$\text{PMD}_i$ is selected as the reliability value.

Figure 10:
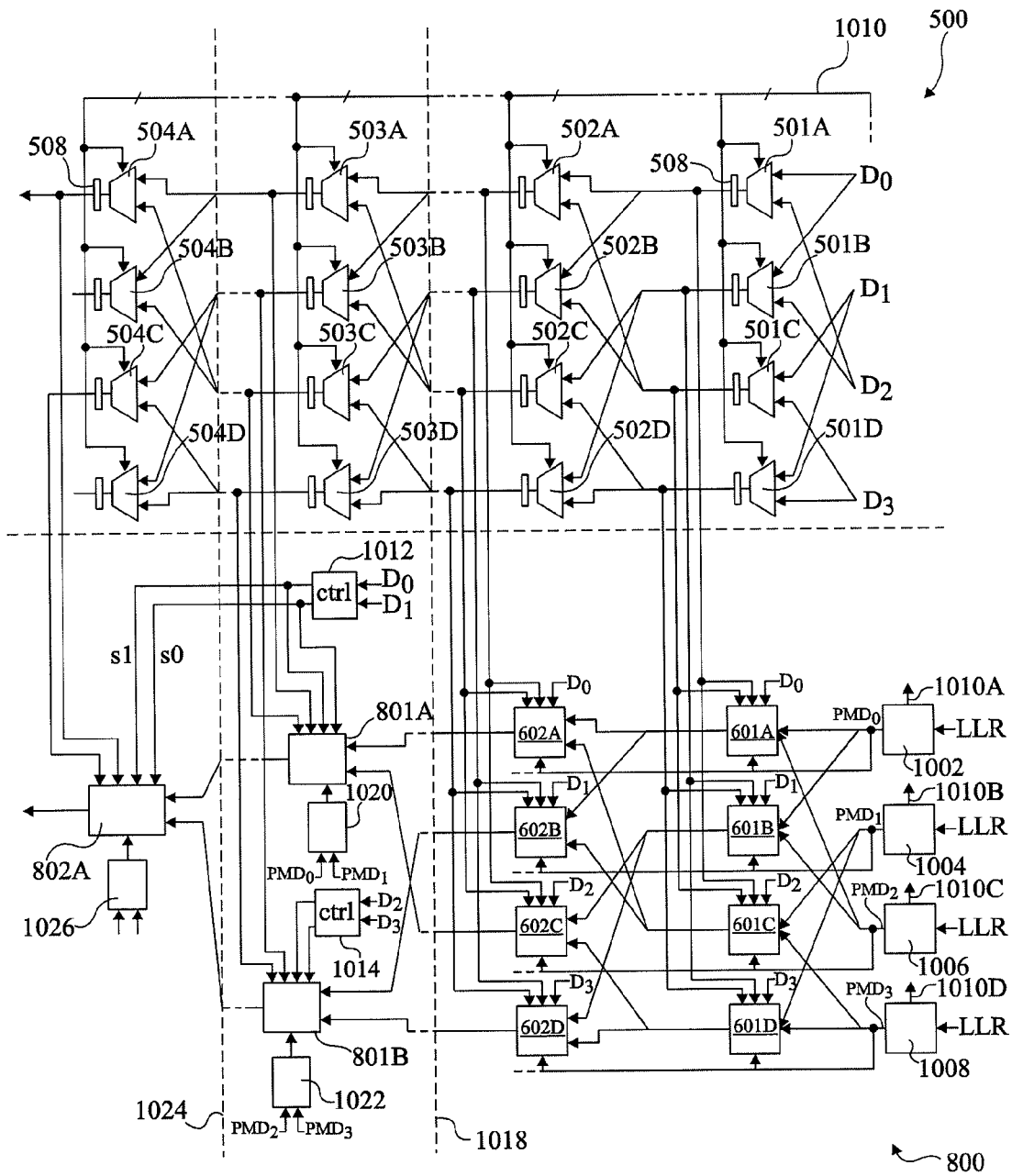
FIG. 10 illustrates a survivors memory unit and a reliability memory unit in more detail according to an embodiment of the present invention.

FIG. 10 illustrates in more detail the interconnections between the SMU 500 and RMU 800 of FIGS. 5 and 8 respectively. For each state there is a corresponding computation block, in this example four computation blocks 1002, 1004, 1006 and 1008 corresponding to the four states. These blocks 1002 to 1008 receive LLR values for a previous symbol received. The LLR values are for example 6-bit signed values. Based on the LLR values, blocks 1002 to 1008 determine a corresponding control signal 1010A to 1010D for controlling corresponding multiplexers of each stage of the SMU 500, and also corresponding PMD values $\text{PMD}_0$ to $\text{PMD}_3$, which are provided to the RMU logic units 806 of RMU 800. These blocks 1002 to 1008 for example correspond to add compare select (ACS) blocks, which are known in the art, and the operation of which will therefore not be described in detail.

Each multiplexer 501A to 501D is controlled by one of the computation blocks 1002 to 1008 to select one or the other of the data inputs to be provided at its output.

The outputs of the multiplexers 501A to 501D of the first stage are coupled to certain ones of the RMU logic units 601A to 601D of the RMU stage 601. As explained above, in the present example, the $i^{th}$ logic unit receives the values from the $i^{th}$ and $i^{th}+\text{NS}/2$ SMU logic units, with $i^{th}+\text{NS}/2$ being between 0 and NS−1.

The logic units 601A to 601D of the first stage 601 also receive PMD values from computation blocks 1002 to 1008 respectively. For example, block 1002 determines the PMD of the paths from states "00" and "01". The PMD values are also provided on the input lines 714 of each of the logic units 608, as shown in FIG. 7.

Two full stages 601 and 602 are illustrated in FIG. 10, although as indicated by dashed line 1018, additional full stages may be provided.

The first half stage 801 of the RMU is also shown in FIG. 10, comprising logic units 801A and 801B. Logic unit 801A receives the outputs of multiplexers 503A and 503C, while logic unit 801B receives the outputs of multiplexers 503B and 503D.

Control blocks 1012 and 1014 of the RMU 800 correspond to the control block 932 of FIG. 9, and receive the inputs $D_i$ and $D_{c(i)}$. In the present example, control block 1012 receives the values $D_0$ and $D_1$, and provides the determined values of s0 and s1 to the RMU logic units 801A and 802A. The control block 1014 receives the values $D_2$ and $D_3$ and provides the determined values of S0 and S1 to the RMU logic unit 801B.

PMD minimum function blocks 1020 and 1022 of the RMU 800 receive $\text{PMD}_i$ and $\text{PMD}_{c(i)}$ values for the corresponding state transitions, and determine the minimum PMD value min_$\text{PMD}_i$ to be provided on the input line 924 of each logic unit, as shown in FIG. 9. In this example, function block 1020 receives the values $\text{PMD}_0$ and $\text{PMD}_1$, while function block 1022 receives the values $\text{PMD}_2$ and $\text{PMD}_3$.

As indicated by dashed line 1024 in FIG. 10, there may be additional half stages of the RMU, not shown in FIG. 10.

In the embodiment of FIG. 10, the final stage of the RMU comprises a single logic unit 802A and corresponding PMD computation unit 1026. It is possible to provide only a single logic unit in the final stage, as at this stage only one path remains, and thus if two logic units were provided, the reliability value provided by each would be the same.

The RMU logic unit 806 allows two standard RMU logic units 608 to be merged, thereby allowing the number of RMU logic units in these stages to be halved compared to the full stages of RMU 600. In some embodiments, two of the RMU logic units 806 are also merged, thereby allowing the number of RMU logic units in some stages of the RMU to be reduced to just one quarter of those of the full stages of RMU, as will now be described with reference to FIGS. 11 and 12.

Figure 11:
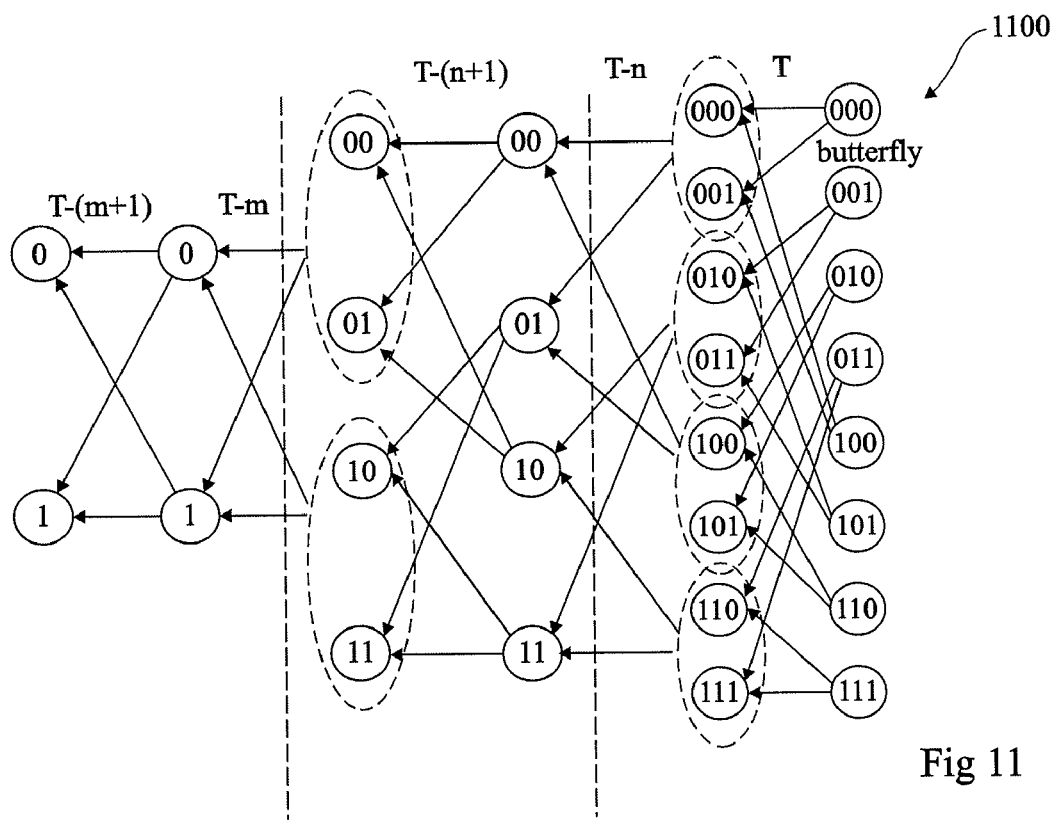
FIG. 11 shows a trellis diagram illustrating the principle of the SOVA decoding using quarter stages according to an embodiment of the present invention.

FIG. 11 shows a trellis 1100 that illustrates how eight states can be reduced to just two. For the state transitions T to T−n, n being equal to 1 or more, there are eight states in each stage. When implemented in the RMU, these states correspond to standard RMU logic units 608.

For the previous state transitions T−(n+1) to T−m, m being equal to n+2 or more, there are four states in each stage. When implemented in the RMU, these states correspond to the RMU logic units 806.

For the state transitions T−m to T−(m+1), there are just two states in each stage. When implemented in the RMU, these states correspond to an RMU logic unit 1200 that will now be described with reference to FIG. 12.

Figure 12:
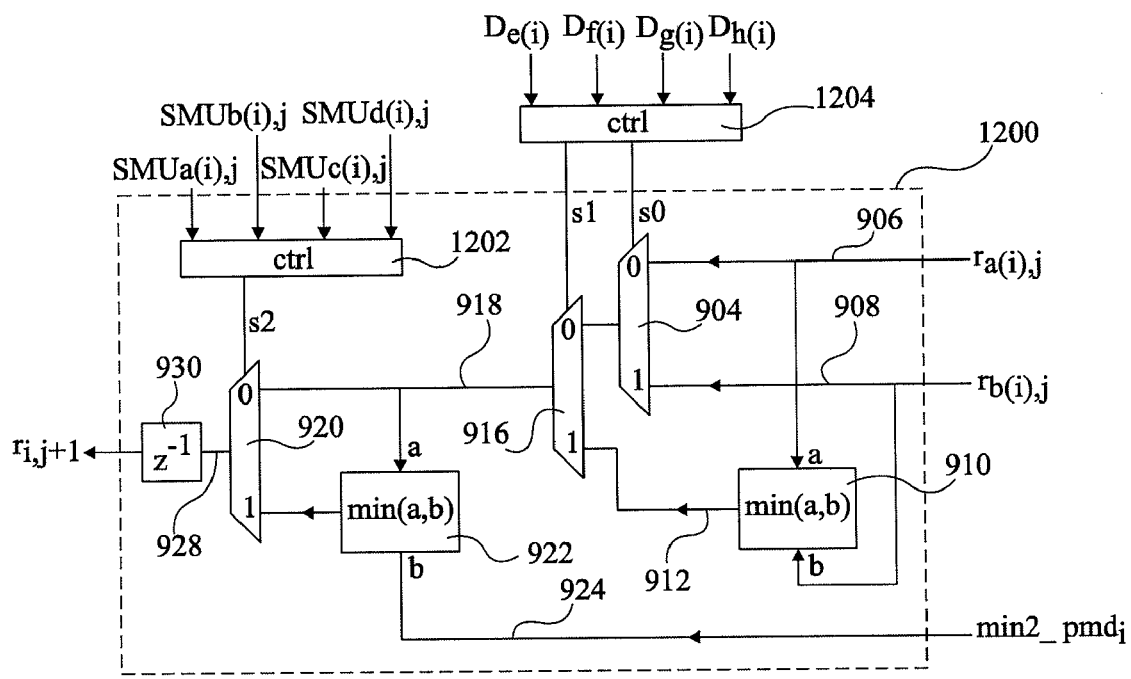
FIG. 12 illustrates a logic unit of the reliability memory unit in more detail according to an alternative embodiment of the present invention.

FIG. 12 illustrates the RMU logic unit 1200 that corresponds to the combination of two RMU logic units 806. Many of the elements in RMU logic unit 1200 are the same as those in RMU logic unit 806, and these elements have been labelled with like references and will not be described again in detail.

In RMU logic unit 1200, the multiplexer 920 is controlled by a control block 1202, based on input signals $\text{SMU}_{a(i),j}$, $\text{SMU}_{b(i),j}$, $\text{SMU}_{c(i),j}$ and $\text{SMU}_{d(i),j}$. The functions a(i), b(i), c(i) and d(i) depend on the trellis, and correspond to the states connected to the group state of the present RMU logic unit. In this example a(i)=2i, b(i)=2i+NS/2, c(i)=2i+1, and d(i)=2i+NS/2+1, i being equal to 1 or 0. The multiplexers 904, 916 are controlled by signals S0 and S1 respectively, which are generated by a control block 1204 based on four input signals $D_{e(i)}$, $D_{f(i)}$, $D_{g(i)}$ and $D_{h(i)}$. The functions e(i), f(i), g(i) and h(i) depend to the trellis, and correspond to the states that have been grouped to create the present RMU logic unit. In this example, e(i)=4i, f(i)=4i+1, g(i)=4i+2 and h(i)=4i+3, i being equal to 1 or 0.

Furthermore, block 922 in RMU logic unit 1200 receives a PMD value min2_$\text{PMD}_i$, equal to the minimum of the PMD values corresponding to the grouped states in the present RMU logic unit 1200. Thus in this example, min2_$\text{PMD}_0$ is equal to the minimum of the PMD values $PMD_0$ to $PMD_3$, while $min2\_PMD_1$ is equal to the minimum of the PMD values $PMD_4$ to $PMD_7$.

Thus a SOVA decoder has been described in which some of the stages of a reliability memory unit are compact stages comprising less logic units than the number of states. These compact stages are advantageously of smaller size than the full stages, as they use half or less of the number of buffers, and it is the buffers that consume a significant area of the RMU. There are at least two full stages, after which the number of paths can be reduced. In some cases there may between two and eight full stages, depending on factors such as the number of states.

Advantageously, the final stage comprises just one logic unit, and thus a single buffer.

Having thus described at least one illustrative embodiment of the invention, various alterations, modifications and improvements will readily occur to those skilled in the art.

For example, it will be apparent to those skilled in the art that while a particular example of a convolutional encoder has been provided in FIG. 2, the invention may be applied to many different types of convolutional encoder. Furthermore, the convolutional encoder could be based on more than four states, and the symbols could comprise more than 2 bits.

Furthermore, while in the examples provided there are four logic units in a full stage and two logic units in a half stage, full stages could comprise more than four logic units, for example 8 or 16 logic units, leading to half stages of 4 or 8 logic units respectively.

While in the example of an RMU logic unit the function blocks 910 and 922 and the PDM value on line 924 are all based on a minimum function, it will be apparent to those skilled in the art that other functions could be used.

What is claimed is:

1. A soft output Viterbi algorithm (SOVA) decoder arranged to decode received symbols, the SOVA decoder comprising:
    a reliability memory unit (RMU) comprising:
        a plurality of RMU stages, at least some of the plurality of RMU stages comprising a plurality of logic units, the plurality of logic units of at least one RMU stage being coupled to the plurality of logic units of a subsequent RMU stage, the RMU being arranged to generate, at an output of a final RMU stage of the plurality of RMU stages, a first reliability value corresponding to a decoded data value of at least one of the received symbols, each of the plurality of logic units comprising circuitry configured to determine a second reliability value and a buffer for storing the second reliability value, the plurality of RMU stages comprising:
            a plurality of full RMU stages configured to be controlled based on a first set of symbols of the received symbols; and
            a plurality of compact RMU stages configured to be controlled based on at least one symbol received prior to the first set of symbols, each compact RMU stage comprising half or less than half a number of logic units in each full RMU stage.

2. The SOVA decoder of claim 1, wherein:
    at least one of the plurality of logic units of each compact RMU stage is configured to perform substantially a same function as that which at least two of said plurality of logic units of said plurality of full RMU stages are configured to perform.

3. The SOYA decoder of claim 1, wherein the plurality of compact RMU stages comprises:
    a first plurality of compact RMU stages comprising at least one logic unit that is configured to perform substantially the same function as that which two of said logic units of said plurality of full RMU stages are configured to perform; and
    a second plurality of compact RMU stages comprising at least one logic unit that is configured to perform substantially a same function as that which four of said logic units of said plurality of full RMU stages are configured to perform.

4. The SOYA decoder of claim 3, further comprising a survivors memory unit (SMU) comprising a plurality of SMU stages, each SMU stage comprising a plurality of SMU multiplexers, the plurality of SMU multiplexers of at least one SMU stage being coupled to the plurality of SMU multiplexers of a subsequent SMU stage, and at least one SMU multiplexer of the plurality of SMU multiplexers of each SMU stage being configured to be controlled based, at least in part, on a log-likelihood ratio value for the at least one of the received symbols, wherein at least one SMU output of the plurality of SMU multiplexers of each SMU stage is used to control at least one logic unit of a corresponding RMU stage of the RMU.

5. The SOVA decoder of claim 4, wherein each of the full RMU stages comprises:
    a first RMU multiplexer comprising:
        a first RMU input for receiving a third reliability value;
        a second RMU input for receiving a fourth reliability value; and
        a first RMU output for outputting a first output value selected from one of the third and fourth reliability values, wherein the selection is based on the decoded data value determined for the at least one of the received symbols; and
    a second RMU multiplexer comprising:
        a third RMU input coupled to the first RMU output of the first RMU multiplexer;
        a fourth RMU input coupled to receive an input value determined based on the first RMU output of the first RMU multiplexer and a path metric difference value; and
        a second RMU output for outputting a second output value selected from one of the third and fourth RMU inputs, wherein the selection is based on the at least one SMU output of a first and a second SMU multiplexer of the plurality of SMU multiplexers in one of the plurality of SMU stages.

6. The SOVA decoder of claim 4, wherein at least one logic unit of the first and second plurality of compact RMU stages further comprises:
    at least one first RMU multiplexer comprising:
        a first RMU input for receiving a third reliability value;
        a second RMU input for receiving a fourth reliability value;
        a third RMU input coupled to receive a first input value determined based on the first and second RMU inputs; and
        a first RMU output for outputting a first output value selected from one of the first, second and third RMU inputs, wherein the selection is based on the decoded data value determined for the at least one of the received symbols; and at least one second RMU multiplexer comprising:
- a fourth RMU input coupled to the first RMU output of the at least one first RMU multiplexer;
- a fifth RMU input coupled to receive a second input value determined based on the first RMU output of the at least one first RMU multiplexer and a path metric difference value; and
- a second RMU output for outputting a second output value selected from one of the fourth and fifth RMU inputs, wherein the selection is based on the at least one SMU output of a first and a second SMU multiplexer of the plurality of SMU multiplexers in one of the plurality of SMU stages.

7. The SOVA decoder of claim 6, wherein at least one of the plurality of SMU multiplexers of a first SMU stage of the plurality of SMU stages receives a plurality of input decision values based on at least one decoded data value for at least one of a plurality of state transitions determined based on the at least one of the received symbols, and wherein said at least one of the at least one first RMU multiplexer of at least one logic unit of at least one of said first plurality of compact RMU stages is controlled based on two of said plurality of input decision values.

8. The SOVA decoder of claim 6, wherein at least one of the plurality of SMU multiplexers of a first SMU stage of the plurality of SMU stages receives a plurality of input decision values based on the decoded data value determined for the at least one of the received symbols, and wherein said at least one of the at least one first RMU multiplexer of at least one logic unit of at least one of said second plurality of compact RMU stages is controlled based on four of said plurality of input decision values.

9. The SOVA decoder of claim 7, further comprising at least one control block arranged to generate control signals for controlling said at least one of the at least one first RMU multiplexer based on said plurality of input decision values.

10. The SOVA decoder of claim 5, wherein the value at a third input of one or more multiplexers of each logic unit of each compact RMU stage is determined as a minimum of first and second inputs to the one or more multiplexers, and the value at a second input of a second multiplexer of each logic unit of each compact RMU stage is determined as a minimum of an output of at least one third multiplexer and a corresponding path metric difference value.

11. The SOVA decoder of claim 1, wherein the final RMU stage comprises only a single logic unit.

12. A decoding system comprising:
- an input for receiving at least one log-likelihood ratio value for the at least one of the received symbols; and
- the SOVA decoder of claim 1.

13. A set-top box comprising the decoding system of claim 12.

14. A mobile telephone comprising the decoding system of claim 12.

15. A transmission system comprising:
- a convolutional encoder arranged to generate a plurality of encoded symbols based on a plurality of encoding states of a finite state machine, said plurality of encoding states being determined based on one or more data bits to be encoded; and
- the decoding system of claim 12 coupled to the convolutional encoder.

16. The SOVA decoder of claim 1, wherein the first set of symbols of the received symbols comprises a previous $L_F$ symbols received.

17. A decoder comprising:
- a plurality of first logic units configured to determine first reliability values for a first received symbol of a plurality of received symbols; and
- a plurality of second logic units configured to determine second reliability values for a second received symbol of the plurality of received symbols, wherein a quantity of the second reliability values is less than or equal to half of a quantity of the first reliability values.

18. The decoder of claim 17, wherein at least one of the second reliability values is determined based on at least two of the first reliability values.

19. The decoder of claim 17, wherein the plurality of first logic units are configured to determine the first reliability values using information obtained from at least one log-likelihood ratio, wherein the at least one log-likelihood ratio is determined based on the plurality of received symbols.

20. A method for decoding received symbols, the method comprising:
- determining first reliability values for at least one first symbol of the received symbols; and
- determining second reliability values for at least one second symbol of the received symbols, wherein a quantity of the second reliability values is less than or equal to half of a quantity of the first reliability values.

21. The method of claim 20, wherein at least one of the second reliability values is determined based on at least two of the first reliability values.

22. The method of claim 20, wherein determining the first and the second reliability values comprises using information obtained from at least one log-likelihood ratio, wherein the at least one log-likelihood ratio is determined based on the received symbols.

23. An apparatus for decoding received symbols, the apparatus comprising:
- means for determining first reliability values for at least one first symbol of the received symbols; and
- means for determining second reliability values for at least one second symbol of the received symbols, wherein a quantity of the second reliability values is less than or equal to half of a quantity of the first reliability values.

24. The apparatus of claim 23, wherein determining at least one of the second reliability values comprises performing a computation using at least two of the first reliability values.

25. The apparatus of claim 23, wherein determining the first and the second reliability values comprises using information obtained from at least one log-likelihood ratio, wherein the at least one log-likelihood ratio is determined based on the received symbols.

* * * * *

UNITED STATES PATENT AND TRADEMARK OFFICE
CERTIFICATE OF CORRECTION

PATENT NO. : 8,370,726 B2
APPLICATION NO. : 12/817613
DATED : February 5, 2013
INVENTOR(S) : Vincent Heinrich It is certified that error appears in the above-identified patent and that said Letters Patent is hereby corrected as shown below:

In the Claims:

At column 12, line 1, claim 3, the word "SOYA" should read --SOVA--.

At column 12, line 13, claim 4, the word "SOYA" should read --SOVA--.

Signed and Sealed this
Seventh Day of May, 2013

Teresa Stanek Rea
*Acting Director of the United States Patent and Trademark Office*